United States Patent
Clayton et al.

(10) Patent No.: US 6,725,022 B1
(45) Date of Patent: Apr. 20, 2004

(54) METHOD AND APPARATUS FOR ENABLING THE SELECTION OF CONTENT ON A WIRELESS COMMUNICATION DEVICE

(75) Inventors: Mark Clayton, Phoenix, AZ (US); Richard L. Blanco, Mesa, AZ (US); William S. Hede, Lake in the Hills, IL (US); David T. Knappenberger, Tempe, AZ (US); Merlin Smith, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 569 days.

(21) Appl. No.: 09/665,610

(22) Filed: Sep. 20, 2000

Related U.S. Application Data

(60) Provisional application No. 60/155,500, filed on Sep. 22, 1999.

(51) Int. Cl.[7] .............................. H04B 1/18; H04H 1/00
(52) U.S. Cl. ................ 455/154.1; 455/3.04; 455/150.1; 455/158.4; 455/414.1; 455/566
(58) Field of Search ................ 455/3.01–3.04, 455/3.06, 404.2, 414.1, 414.2, 414.3, 456.1, 456.2, 456.3, 456.6, 457, 41.2, 566, 154.1, 150.1, 158.4

(56) References Cited

U.S. PATENT DOCUMENTS

| | | | |
|---|---|---|---|
| 5,664,948 A | * | 9/1997 | Dimitriadis et al. .... 434/307 R |
| 5,710,884 A | | 1/1998 | Dedrick |
| 5,752,186 A | | 5/1998 | Malackowski et al. |
| 5,855,008 A | | 12/1998 | Goldhaber et al. |
| 5,898,910 A | * | 4/1999 | Miyake et al. ........... 455/186.1 |
| 5,983,094 A | | 11/1999 | Altshul et al. |
| 6,023,241 A | | 2/2000 | Clapper |
| 6,026,375 A | | 2/2000 | Hall et al. |
| 6,148,253 A | * | 11/2000 | Taguchi et al. ................ 701/48 |
| 6,163,683 A | * | 12/2000 | Dunn et al. .............. 455/151.1 |
| 6,181,921 B1 | * | 1/2001 | Konisi et al. ............. 455/186.2 |
| 6,445,306 B1 | * | 9/2002 | Trovato et al. ......... 340/825.24 |
| 6,516,466 B1 | * | 2/2003 | Jackson ....................... 725/62 |

FOREIGN PATENT DOCUMENTS

WO    WO 98/47295 A1    10/1998

* cited by examiner

*Primary Examiner*—Quochien B. Vuong
*Assistant Examiner*—Simon Nguyen

(57) ABSTRACT

An internet radio for portable applications and uses such as in an automobile enables the selection of content on a wireless communication device comprising the steps of providing a format for displaying content on said wireless communication device; detecting the loss of a signal for a channel providing a predetermined genre; and providing a new format for displaying content having a new channel providing the predetermined genre to replace the lost channel. Customized information is also communicated to the radio such as stock quotes, travel information, advertising, and e-mail. Onboard global positioning allows for channel updating by location, traffic information, geographic advertising and available similar content.

15 Claims, 5 Drawing Sheets

METHOD AND APPARATUS FOR ENABLING THE SELECTION OF CONTENT ON A WIRELESS COMMUNICATION DEVICE

"The present application is based on prior U.S. application Ser. No. 60/155,500, filed on Sep. 22, 1999, which is hereby incorporated by reference, and priority thereto for common subject matter is hereby claimed."

BACKGROUND OF THE INVENTION

Entertainment systems commonly found in today's vehicles usually consist of a radio, CD/DVD player, cassette player and optionally a GPS based navigation device. The following problems are common to all such existing vehicular entertainment systems: Inadequate control interface for selecting from large numbers of broadcasts, lack of personalized broadcasts, no feature expansion, inadequate storage capabilities, no integration with portable data devices, inability to manage broadcast advertisements, and outdated navigation entry. Following is a description of each of these sets of problems.

Radios in vehicles have historically received only amplitude modulation (AM) band and frequency modulation (FM) band terrestrial radio broadcasts. AM and FM radio stations have a transmission range limited to a relatively small geographic area by government regulations. Because the number of broadcasts that can be received in most geographic areas has been relatively small, selecting a broadcast to hear in a vehicle has traditionally required no more than four types of simple receiver controls: (1) an AM/FM band selector, (2) a tuning control to allow the listener to manually scan all possible broadcast frequencies within a band, (3) a scan control that finds and plays a few seconds of each station that has sufficient signal strength to be clearly heard, and (4) a small number of preset push buttons that can each be programmed by the listener to tune to one radio station of a set band and frequency.

The small and inflexible number of radio controls creates the following two related problems: First, no method exists to select all existing AM/FM radio stations by station format or to select by format from thousands of forthcoming digital audio broadcasts. Radio stations broadcast a set format of programming (country music, news, rock music, talk, etc.). Many large metropolitan areas have up to 100 combined AM and FM stations of as many as 20+ different possible formats whose signals can be clearly received throughout most of the metropolitan area with as many more fringe stations that can be received in parts of the area. A listener must now know the band and frequency of a radio station having a desired format he enjoys. Unfortunately, in a large metropolitan area, there may be more stations of a desired format or formats than can be selected with an existing radio's few simple preset buttons.

Several proposals have unsuccessfully tried to correct this problem by enhancing broadcast systems. Some FM stations do broadcast format information along with other digital data about the station's programming using a method known as Radio Broadcast Data System (RBDS), also known as RDS, involving the use of FM sub-carriers. The Program Type Category (PTY) feature of an RDS radio allows searching for radio stations by their format. There are now approximately 13 manufacturers of RBDS car receivers. With an RBDS car radio, a user could tune to FM stations by their format.

However, RBDS/RDS has not been well received in the United States. Since the introduction of RDS in 1995 there were only 706 RDS broadcasters versus approximately 7,700 total FM radio stations as of a July 1998 report by the Electronic Industries Alliance. Worse yet, a February 1999 report by the Consumer Electronics Manufacturers Association shows that of this small number of RDS broadcasters in the United States, only 41% broadcast their format. Therefore, RDS broadcasts do not now solve the problem for the vast majority of listeners.

The 4,784 AM stations licensed by the FCC as of May 1999 do not have an equivalent sub-carrier available to them as do FM stations to send out data about their programming. Although an international consortium of 40 broadcasters and electronic manufacturers known as Digital Radio Mondiale (DRM) have proposed a digital AM broadcast system that would allow a DRM radio to tune to stations by their format, the standards for such a system have not yet been established.

Compounding the problem, new. multimedia devices with wireless Internet and satellite connectivity are expected to appear in vehicles in the very near future. These multimedia devices will be able to receive existing analog AM, FM and TV audio broadcasts as well as receive and record thousands of new digital audio broadcasts. A wireless Internet receiver can receive thousands of digital broadcasts from the Internet from cellular (AMPS, GMS, etc.), paging, FM sub-carrier, satellite and other frequencies. As of June 1999, BRS Media consultant's report shows 2,415 Internet audio broadcasts from worldwide AM/FM radio stations that simulcast their live audio broadcasts onto the Internet, up from 1,252 the previous year. Similar future Internet audio broadcast growth is expected. In addition, satellite broadcasters such as CD Radio, XM Radio and WorldSpace are expected to transmit to vehicles at least 100 new digital audio stations apiece over satellite S-band and L-band frequencies within the next few years. These stations can be received over broad geographic areas.

The vast amount of broadcast content soon to be available easily overloads existing simple vehicle radio control designs. Another shortcoming of today's vehicles is that presets for existing AM/FM radio stations are only good for one geographic location. When traveling long distances outside an area where radio station formats are known by the listener, the most desirable radio stations from the old area that are stored in the radio's preset button memory no longer work. The listener must manually tune the radio to each available station in the new area and listen to each station to determine if it has a desired format. If the traveler is used to hearing a syndicated program that is broadcast over many radio stations throughout a country, then he may not know what station in the new area carries the syndicated program or what time the broadcast appears in the new area. Several prior attempts have unsuccessfully overcome these two related problems. They fall into two categories.

One is the RDS broadcast system mentioned above, which broadcasts information about station formats. RDS also provides an alternative frequency list of stations playing a specific program with the same PI (program identification) code; this allows many RDS based radios to automatically switch to a new station playing the same program if the current station falls out of transmission range. However, as was mentioned above, this solution suffers in that few FM stations in the U.S. broadcast program information via RDS, and RDS does not cover AM radio stations.

The second type of solution implemented by automotive radio manufacturers such as Panasonic, Pioneer, Sony and others consists of an internal database of national radio station information contained in non-volatile memory inside a radio receiver. In some cases, this database is updateable by manual or automatic means. These radios require the listener to indicate each new location. Once that is done, frequencies of radio stations from the database that are in the new area and match the listener's desired formats are played in sequence or are loaded into the preset memory selections of the radio.

However, this solution has not been optimal as automatic updates to the internal database that account for changes in station formats or new stations are not readily available in all markets throughout a country. Therefore, the database is likely to become unreliable and so not useful. Further, such databases do not include programming information for stations so they do not help find a station in a new area that runs the same syndicated programming found in the old, familiar broadcast area.

When driving, it would also be advantageous to receive information of personal interest when desired during a trip rather than having to wait for a scheduled broadcast of that information. RDS broadcasts, in addition to providing programming specific information as mentioned above, are also capable of constantly transmitting travel specific information such as localized traffic conditions or weather reports. However, as described above, RDS broadcasts are not in wide use in the United States and other areas, and so not even travel specific information is widely available through RDS.

Also, drivers may want more than just travel related personalized information when they travel. For example, they may want to hear news alerts about subjects that interest them, stock price alerts for securities in their portfolio, location based alerts such as reminders to do things when on a certain route, etc. While some of this desired information may be eventually broadcast by a radio station, it may be broadcast only after the listener has left the vehicle. It would be best to use travel time to hear what is desired.

Some personalized broadcast information is available today for the mobile and stationary listener. Such data broadcasts are usually done through FM sub-carriers. Examples of such FM sub-carrier based services are financial and traffic information from companies such as Data Broadcasting and Cue. Unfortunately, each FM sub-carrier broadcast usually requires a dedicated receiver for that particular broadcast.

As new personalized digital information services are offered, a receiver should ideally be able to play any new service without requiring the user to purchase a new receiver. Further, such services should be easy to add and operate and require little effort to procure. Almost no automotive entertainment devices today would meet this need. To solve this problem, a receiver should ideally be microcomputer controlled and so able to run computer applications downloaded into the memory of the device. A newly downloaded and installed application could provide any desired new feature or service. Such programs should be as simple to select, install and run as changing channels on an existing radio.

Vehicular entertainment devices that are computer controlled and so can be programmed to offer new services by simply installing a new application into the computer have been recently introduced by Microsoft and Clarion under the name "AutoPC." While these devices can be programmed to offer new services, new applications are not immediately available to a motorist. The user must first purchase the program on a CD disc and then install it in their AutoPC through a CD-ROM player, just as they would install a new program on their home computer. The disadvantage of using this method of updating programs on a computer controlled multimedia receiver is that when you most may want to use a new service, it may not be available.

A number of new digital compressed audio formats have developed in the past few years for music play back, most notably the MP3 format. They have the advantage of requiring less than one tenth the space of conventional recordings while retaining good audio fidelity. While some MP3 players are in use in vehicles, these players often require the user to move a hard drive back and forth from the vehicle to a computer to transfer files to the drive. Such movement can subject the drive to damage.

Although entertainment systems in vehicles have commonly included a cassette or CD-ROM player to play back stored entertainment or information from cassette tape or CD-ROM audio disc, such devices have not commonly allowed recording of the radio in the vehicle at preset times for later play back. If a listener wants to hear one or more syndicated radio programs when driving, but those programs already aired at an earlier time, the listener misses the broadcasts.

While several attempts have been made to solve this problem by recording directly from the vehicle's radio, they do not allow recording of more than one broadcast at a time. Further, such devices are limited to recording only those syndicated radio programs broadcast by radio stations in the listener's area.

When audio information is broadcast that the listener would like to remember or reference later, there is no current method to conveniently record that data outside of writing a note or recording a verbal note with a memo device. This may not be possible given the traffic situation at the moment. For example, upon hearing a new song the driver may want to record the name of the song, the artist and the CD's name, but can't do so because both hands are needed for steering.

While some methods have become available for use in limited capture of Internet URL addresses over television broadcasts, currently no systems meet this need for immediate data snapshots of radio broadcasts in vehicles. However, only a small number of radio stations now offer play lists and other related information about their programming on their web sites so that the information a listener may want to reference may not even exist on the station's web site. Another disadvantage of current radio station web sites is that the user must not only remember which station played the broadcast of interest, but also when and what the nature of the message was.

A great deal of personal information that may be useful when driving is increasingly stored and spread across multiple mobile computing or communication devices such as notebook computers, personal digital assistants (PDAs) and cellular phones. These typically contain phone numbers, addresses, to-do lists and other information that could be of use in a vehicle. However, it can be inconvenient to stop the vehicle to get a device to retrieve information when needed or dangerous to use the device when in motion. Limited access to personal computing devices in a vehicle is now only offered by the Microsoft/Clarion AutoPC. However, the AutoPC does not now permit further actions to occur on the data by its applications.

Two further problems exist with broadcast advertisements heard in a vehicle: First, there is an inability to immediately act upon the advertisement. When a radio advertisement runs that a listener in a vehicle wishes to immediately act upon, there is often no way to quickly purchased the advertised goods. If the advertisement contains a phone number that the driver can easily remember and if he has a free hand to dial, he may be able to use a cellular phone and quickly act upon the ad. If not, the desire and opportunity may be lost. A proposed solution for use with digital audio satellite broadcasts potentially solves this problem but has not yet been implemented.

Second, no method to tailor advertisements to listener interests exists. Currently, no method exists to tailor advertisements to a single listener's interests for real-time audio broadcasts since radio advertising is designed to reach a mass audience. However, future digital audio broadcasts are expected that can be transmitted to individual receivers rather than broadcast widely. Such broadcasts may be of existing radio syndicated programs or new material. On demand personalized digital broadcasts are planned by such companies as Command Audio and Information Highway Media Corporation.

Most navigation systems in vehicles use a GPS receiver and a CD-ROM disc based map to show travel along highways. One problem with CD based navigation maps is that they require constant updating to avoid becoming outdated as they cannot show recent construction or changes in highways. Server based navigation avoids the problems of outdated CD maps as the information distributed from a server is constantly updated. Several server based navigation devices are known. However, even server based navigation systems suffer from difficulties in inputting destination addresses. Having to enter an exact street address or cross streets can sometimes take lots of time when driving and can involve input inaccuracies.

DETAILED DESCRIPTION OF THE PRESENTLY PREFERRED EMBODIMENTS OF THE INVENTION

Figure 1:
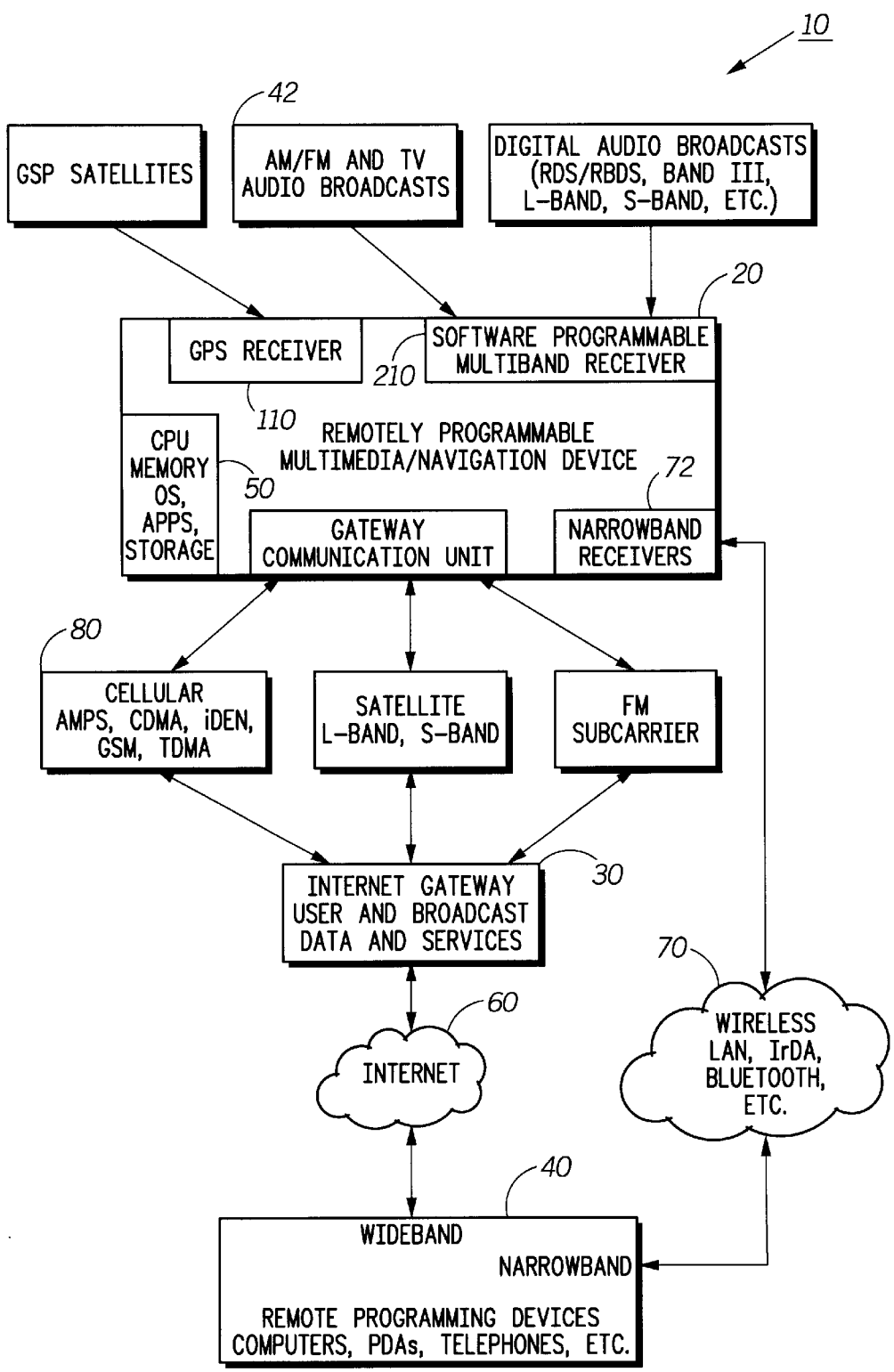
FIG. 1 shows a block diagram of a system overview.

Referring to the drawings, where like elements receive like reference numerals throughout, the invention generally is a computer controlled multimedia entertainment and information system 10. The invention offers information enriched audio broadcasts, personalized information services, integrated access to personal and recorded data, enhanced navigation services and other software expandable services in a vehicle through the use of a wireless Internet connection to an enabling Internet gateway network. As shown in FIG. 1, the invention consists of (1) a remotely programmable, microcomputer controlled multimedia device 20 in a vehicle with a wireless IP address for Internet access, (2) an Internet gateway network 30 that provides programming, information and Internet access to the multimedia device 20, and (3) one or more remote programming devices 40.

The multimedia device 20 includes a computer 50 that preferably runs an operating system and series of applications that control the operation of the device 20. A user operates an application by tuning to a "channel" in keeping with the known radio paradigm and its user friendly operations. The two types of channels preferably available are audio broadcasts (e.g., AM, FM, TV, digital, Internet audio broadcasts and recorded material) and personal information services (e.g., navigation, email, traffic alerts, etc.). Channels are organized in a hierarchy 158 so any one can be easily selected on screen (see FIG. 2). Audio broadcast channels 42 are organized by the format of the broadcast (i.e., country, rock, talk, etc.) and not by the band or frequency of the station. The listener configures the organization of the channels through a remote device 40 via the Internet gateway network 30.

Figure 3:
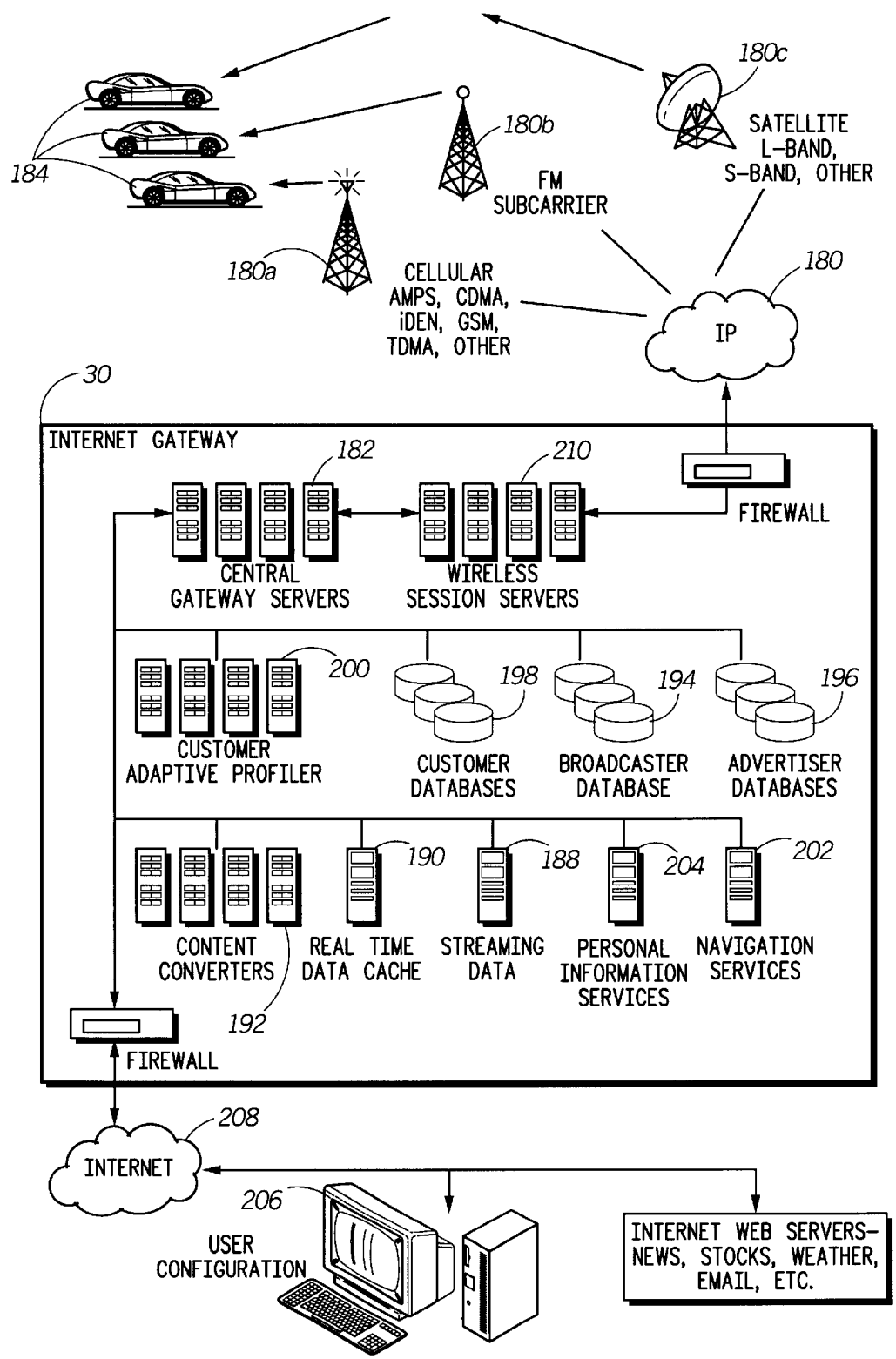
FIG. 3 shows a system diagram of an internet gateway network.

The Internet gateway network 30 is designed to transmit and receive critical information to and from a multimedia device 20 in the vehicle 184 (FIG. 3). Information transmitted preferably includes broadcaster identification that allows the multimedia device 20 to tune to stations by their formats, direct Internet access for streaming audio broadcasts and other Internet content, broadcast advertising database lookup for direct response to advertisements heard in a vehicle, navigation services, delayed digital personalized broadcasts, personal information event notices, and application downloads to create new personal information channels.

Remote programmable devices 40, such as a computer connected to the Internet 60, are used to download information from the Internet gateway network 30 to the multimedia device 20 in the vehicle 184. From a remote device 40, a user can customize the way audio broadcasts and personal information service channels are organized in the vehicle's multimedia device 20, can request new personal information services be downloaded from the Internet gateway 30 to the multimedia device 20, and can retrieve information from the gateway 30 that he has stored there from the vehicle 184. The user can also access his custom profile and billing information records.

FIG. 1 shows many possible wireless communication methods between the vehicle device and the gateway. As those skilled in the art will appreciate, the methods illustrated in FIG. 1 are meant to be representative and do not reflect all possible wireless communication methods that may be employed.

It is thus an object of the invention to allow any AM, FM, TV audio, or digital audio broadcast or any Internet audio broadcast to be easily selected by format (i.e., country, classical, news, rock, talk, etc.) in a vehicle. The user will not need to know the band or frequency of any station to select a broadcast as all types of broadcasts are simply ordered by format. The multimedia device 20 will make the appropriate band and frequency selection when a listener selects a station hierarchically organized under a format category.

It is also an object of the invention to automatically tune to comparable station formats when a vehicle travels out of an area where the existing stations are known to the listener.

It is a further object of the invention that, when a vehicle travels out of an area such that a currently broadcast program fades out, to automatically tune to another station or recorded broadcast playing the same program or at least the same program type.

It is yet a further object of the invention to remotely configure the multimedia device 20 using an Internet gateway network 30 database to download information about all the audio formats and audio broadcasters (e.g., AM/FM/TV/DAB/Internet) possible in a geographic area. The user will choose to show on the radio only those formats and stations he/she desires, blocking out from view all unwanted formats and stations.

It is yet a further object of the invention to add new personal information services (e.g., email, stock quotes, interactive audio games, etc.) to the multimedia device 20 from a wireless Internet connection 60 by downloading applications. Such services are called personal information or data channels in keeping with radio nomenclature as their applications can be used by simply selecting them as you would an audio channel in the main menu or with a preset button.

It is still another object of the invention to remotely configure the system 10 using an Internet gateway network 30 database to present all the personal information services available to the user (i.e., navigation, email, stock quotes, etc.). The user may select only those services he/she desires to use in the vehicle 184.

It is still another object of the invention to allow event driven personal information services to verbalize time specific (e.g., your stock hits new high) or location specific (e.g., traffic incident warning) information using speech synthesis.

It is still another object of the invention to allow recorded compressed audio files and other large data files to be downloaded into the multimedia device 20 from a high speed local area 70 wireless receiver 72. Such downloads may occur at the listener's home or business, or at designated resale locations for such types of data (e.g., record stores, gas stations, etc.).

It is still another object of the invention to allow previously recorded audio broadcasts (usually talk or news oriented programming) to be played back at desired times by recording such broadcasts at a network location and then transmitting these files over a wireless Internet cellular connection 80 at off peak hours to the vehicle 184. Since talk broadcasts result in small compressed files, they can be easily dribbled over a relatively slow speed wide band connection without long delays.

It is still another object of the invention to save enhanced information about selected broadcasts with the press of a button. The information is wirelessly transmitted to a server on the Internet gateway network 30 that can be later retrieved from the user's home or office computer with an Internet connection and web browser.

It is still another object of the invention to allow the selection of live and recorded audio material by format in a vehicle as well as select information services (i.e., phone book, navigation, etc.) by using a combination of a hierarchical menu along with presets that chose a broadcast station or run a selected service application. Selection can be done by pressing directional and preset buttons or by using voice navigation.

It is another object of the invention to present a unique configuration of the system 10 for any number of users so that each user will see only their preferred radio stations and information services when they select their profile at the multimedia device 20.

It is another object of the invention to allow accommodated devices such as notebook computers, PDAs and cellular phones to wirelessly download personal information (i.e., phone numbers, addresses, to-do lists, etc.) into the multimedia device 20.

It is yet another object of the invention to allow phone numbers and addresses downloaded from accommodated devices to be used for navigation and for direct calling.

It is yet another object of the invention to allow purchases to be made of an advertised on air product with the touch of a button.

It is still another object of the invention to listen to advertising customized for listener preferences when playing recorded broadcast programs.

It is still another object of the invention to provide navigation services from the Internet gateway network 30 so maps can remain accurate as they can be centrally updated when highway changes occur.

It is still another object of the invention to provide navigation services from the Internet gateway 30 so that vehicle positions reported by in vehicle GPS devices can be used by personal information services to provide location dependent alerts to the driver.

It is still another object of the invention to allow input of destination addresses for navigation routing from phone numbers or names by doing reverse address lookups from an Internet gateway 30 server and then automatically entering the returned address for the destination.

It is still another object of the invention to allow input of destination addresses for navigation routing from enhanced advertisements that include location information in a data sidecast.

These and other features and advantages of the invention will become apparent to those skilled in the art upon a review of the following detailed description of the presently preferred embodiments of the invention, when viewed in conjunction with the appended drawings.

Figure 2:
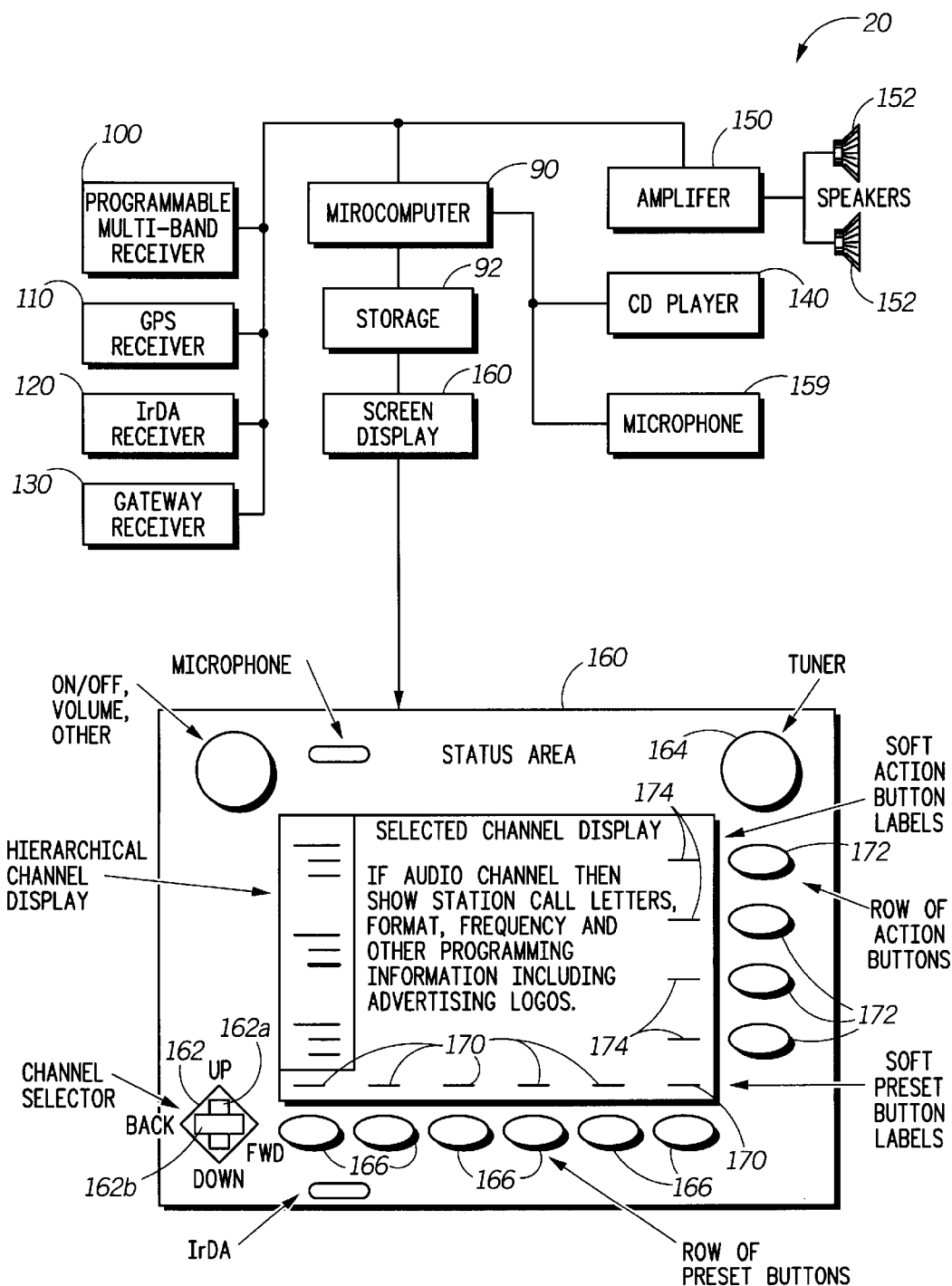
FIG. 2 shows a block diagram of a vehicle multimedia receiver.

Following is a description of the system 10 components and configuration. As FIGS. 1 and 2 show, the multimedia device 20 consists of a computer 50 preferably having a microprocessor and memory 90, and storage devices 92 that contain and run an operating system and applications to control and communicate with four onboard receivers: (1) a software controlled multi-band AM, FM, TV audio and digital audio broadcast receiver 100; (2) a GPS receiver 110 that continuously reports the vehicle's longitude, latitude and altitude; (3) one or more high-speed, narrow band wireless transceivers 120 for fast transmission and reception of large amounts of data from accommodated devices; and (4) a wide band wireless Internet addressable gateway transceiver 130 to receive Internet protocol based audio broadcasts, new applications known as information or data channels, and configuration data from a gateway network 30 created to service the multimedia devices 20. The in-vehicle wireless gateway transceiver 130 can also send information to the gateway network 30 such as requests for navigation data, advertisement responses, purchase requests, etc. The multimedia device 20 also controls attached conventional multimedia storage equipment such as a CD/DVD player 140 or cassette player (not shown). Sound is output through an industry standard amplifier 150 and speakers 152. A microphone 154 allows for voice recognition commands to be given and received by the multimedia device 20.

The multimedia device 20 preferably also contains and controls one or more digital storage devices 92 to which real-time broadcasts can be digitally recorded. The storage devices 92 may be hard drives, flash disks, or other automotive grade storage media. The same storage devices 92 can also preferably store digital data that is wirelessly transferred to the vehicle in faster than real time mode. Examples of such digital materials are MP3 audio files or nationally syndicated radio shows that can be downloaded from the gateway network 30 and played back when desired rather than when originally broadcast.

As FIG. 2 shows, the multimedia device also uses a LCD, LED or similar suitable display screen 160 for an automotive environment to present information to the user and to control the multimedia device 20. Controls shown on the LCD in FIG. 2 are one possible embodiment for control types and location. Those skilled in the art will appreciate that control types and locations may vary in different implementations of the invention. In one presently preferred embodiment, for example, the display screen 160 includes a 5½ inch 640×480, 216 color VGA LCD display 168. In an alternate embodiment, the display can display as little as two lines of text, whereas an upper limit of the screen display 168 can be as large as the intended application may dictate.

The channel selector 162, tuner 164 and preset button 166 controls shown in FIG. 2 allow the user to broadly navigate all the channels of audio broadcasts and information services available on the multimedia device 20. The channel selector 162 allows a user to manually access and select any of the audio and information channels available by browsing through them (up, down, forward, back) in a hierarchical tree. A display 158 of a portion of the hierarchical tree is shown on the screen display 168. The root of the tree, the leftmost part, preferably contains major categories of channels. Possible types of major channel categories could include music, talk, TV audio, recorded audio, personalized directory services and information services. As is explained in detail below, the user can configure the presentation of major categories and subcategories so that he/she sees only those categories of interest.

Under each major channel category, there are preferably subcategories. To see these subdivisions, the user would select the desired major category by pressing the up or down channel selector buttons 162a and then press the forward button 162b when the category desired is highlighted. The user could then see all the channels available under that subcategory in similar fashion and select any of them to play. For example, under the category of music channels, commercial audio broadcasts could be subdivided into 30+ radio industry standard formats (e.g., blues, classical, county, dance, jazz, rock, sports, talk, etc.). To hear a particular country music radio station in a particular geographic area, a user would select the "Music" category by pressing the up or down channel selector buttons 162a and then press the forward channel selector 162b when positioned on "Music." Next, the user would use the up or down channel selector buttons 162a to highlight "Country" and would then press the forward button 162b. The user would then see all the country music channels available in that specific area. Moving the channel selector 162 up or down over each channel preferably causes each audio station to play.

Once a user has moved forward in the hierarchical tree, the subcategory or channels displayed will remain visible until the user presses the back channel selection button 162b that moves the user back up the tree one level. For example, to move back from country broadcasts to select other music formats, the user would press the back button 162b and then select another music format. The multimedia device 20 may be preferably configured so that the last hierarchical display and selection the user made is presented when the device is next turned on.

Preset buttons 166 on the display screen 160 are user configurable buttons that allow the user to select any one channel, group of channels or even channels from different categories that can be played or displayed with the press of a single button. For example, a user could configure a preset button 166 to simply play a favorite country station when pressed. The user could also configure a preset button 166 to display all the country stations in a specific area. The user could even configure a preset button 166 to display their favorite blues, country and rock stations at one time on one screen display 168. Once these groups of channels are displayed, the user can play the radio stations by using the channel selector buttons 166. A preset button 166 can also be assigned to any personal information channel application. For example, assigning a new channel (application) that shows all hospitals in an area would result in a map showing the nearest hospitals to the vehicle's current position when the preset is pushed. User defined labels 170 for preset buttons 166 preferably appear on the screen 168 above the preset buttons 166 to indicate their purpose.

The tuner control 164 shown in FIG. 2 flattens the hierarchical tree. Rather than having to step through categories and subcategories to play a channel, by turning the tuner control 164 the user can play each channel one after the other in the order they appear in the hierarchy 158. If a user has configured the device to show only a few categories of channels, this allows fast sequencing through a channel list. Pressing the tuner control 164 preferably causes the device to scan through the channels as a traditional radio would do, playing a few seconds of each station before moving to the next in the hierarchy 158.

Computer programs running in the multimedia device 20 control the action buttons 172 shown in FIG. 2. Action buttons labels 174 and purposes may change from program to program. A button's label 174 indicates its current function. Some examples of action buttons 172 could be: "INFO" to save extended information on something that is being broadcast (e.g., the Internet web address of a band currently playing); "CALL" to call a phone number from an advertisement; "NAV" to navigate to an address from an electronic address book; or "BUY" to purchase an item currently being advertised.

A microphone input 176 on the face of the display 160 allows users to control the multimedia device 20 verbally rather than through the control buttons. Key word recognition software allows the user to make the same channel selections that could be made from any of the button controls. Audio feedback through speech synthesis allows the user to make selections and hear if any other actions are required. Software or hardware based voice recognition and speech synthesis may be used to implement this feature.

FIG. 3 shows a system drawing of the Internet Gateway Network 30. The Internet gateway network 30 preferably consists of standard Internet TCP/IP protocol communications equipment 180 and computers 182 that serve multiple functions. The gateway 30 is designed to provide wireless Internet access to the multimedia device 20 in the vehicle 184, enhance regular audio broadcasts with extended information, and provide personalized broadcast, information and applications to the vehicle 184.

The gateway 30 serves as an Internet Service Provider to vehicles 184 through various forms of wireless transmission 186. Cellular access is expected to provide the initial form of wireless transmission with satellite transmissions to follow. In some implementations, requests from the vehicle 184 may come through the cellular network 186a while responses may be routed through FM sub-carriers 186b or faster satellite networks 186c. Wireless session servers 210 are preferably dedicated to maintaining connections with the rest of the gateway network 30 no matter what form of transmission is used.

To insure adequate throughput to vehicles 184, the gateway network 30 will cache most requested Internet data in a real time data cache 190, as well as convert retrieved Internet content through content converts 192 for appropriate display or verbalization on the multimedia device 20. Dedicated streaming data servers 188 will be used to broadcast personalized audio broadcasts to the vehicle 184, as well as rebroadcast other Internet audio broadcasts.

The Internet gateway network 30 also maintains a database management system to control several important system databases. The gateway 30 provides a broadcaster relational database 194 containing information about all AM, FM and TV analog audio broadcasts that can be received in a vehicle 184 within the host nation of the gateway network 30 (e.g., radio station call letters, programming format, frequency assignment, program listing, etc.). Related databases (not shown) may maintain similar information for new digital broadcasters such as satellite radios who transmit over large geographic areas and for international Internet audio broadcasts. Information in the database concerning constantly changing program listings (e.g., song play lists, etc.) are preferably continuously updated throughout a day.

Advertising databases 196 provide information about advertisements (e.g., advertiser name, ad content, time of ad run, etc.) that are inserted into real-time radio broadcasts and into digital personalized broadcasts. In one embodiment of the system 10, when a user wishes to purchase a product or get more information about a product while in the vehicle 184, the user can press a "BUY" or "INFO" button on the multimedia device 20, which transmits to the gateway network 30 the location of his vehicle 184 (GPS derived), the date and time of the button press, and the channel selected. The advertised item is then looked up in the database 196, and the user is charged for its delivery or is sent more information about the product. In an alternative embodiment, enhanced advertising information for short periods of time may be pushed to the multimedia device 20 from the gateway 30 at set intervals. Only those ads offering immediate purchase or additional information will preferably show indicators for these actions.

User profile databases 198 contain information about the user's system preferences (e.g., channels selected), billing information and a purchasing interest profile. Information in advertising databases can be compared against a user's purchasing interest profile through an adaptive profiler 200 so that advertisements inserted into delayed personalized digital broadcasts mesh with that individual's buying interests. If there are multiple users on one account (e.g., family members) then each user will preferably have a unique profile in the user database 198.

Users are also allocated storage space on the gateway's servers for their own use. Enhanced live or recorded broadcasts that contain information the user may want to reference later (e.g., the web address of the band currently playing) allow the listener to press a button on the multimedia device 20 to transmit and store that information on their user pages on the gateway 30.

The gateway 30 also provides navigation services through a dedicated computer 202 to the vehicle 184. The vehicle 184 provides location information from its GPS receiver 110 (FIG. 2) to the gateway 30, and the gateway 30 in turn provides mapping services to the vehicle showing travel routes or locations of interest. Coupled with the advertising database 196, drivers can see map locations related to recent advertisements and get navigation guidance to these locations. For example, the driver could get directions to the nearest chain restaurant whose commercial just played offering a lunch special.

The gateway 30 also transmits other software applications to the vehicle 184 for use in the multimedia device 20. These applications are referred to as channels and comprise the personal information services of the system 10 (navigation, email, etc.). These applications or channels can be downloaded to the vehicle 184 from a computer 204 at any time to instantly add to the features of the multimedia device 20.

The gateway 30 further transmits events to the vehicle based on preferences provided by the user in a user profile stored on a stand alone personal computer 206. Such events could be, for example, stock market alerts (i.e., set an alert when a stock reaches a set value), traffic alerts based upon the user's route (notifies of any delays as they happen in real time on the route), email messages, or the like.

Several types of remote programming devices 40 may send different types of data to the multimedia device 20, as shown in FIG. 1. Such devices 40 can also receive different types of data from the multimedia device 20 through the Internet gateway 30. Configuration data determines which formats of audio broadcasts (i.e., AM, FM, DAB, Internet broadcast) and information services (i.e., applications for navigation, stock reports, weather reports, etc.) can be received by the remote device 40, as well as what channels are associated with preset buttons 172 (FIG. 2).

Configuration data is preferably sent to the multimedia device 20 through a computer 206 with an Internet connection 208 using a web browser, as shown in FIG. 3. Due to the large number of possible analog, digital and Internet based broadcasts available for reception by the multimedia receiver 210 (FIG. 1), choosing from the huge variety of broadcasts is less complicated if it is preprogrammed or preconfigured in advance by the user through a remote computer 206 rather than from the multimedia device 20 itself. The user would log onto the Internet 208 in a manner generally known in the art and then access the configuration web page of the Internet gateway network 30. Once the user has configured the web page selections as desired, he/she could submit the changes. The new configuration could then be transmitted to the multimedia device 20 in the vehicle 184 from the gateway network 30.

Personal directory data could be transferred locally to the computer 206 using such local wireless technology as IrDA or Bluetooth. Examples of such remote devices 40 include notebook computers, PDAs or cellular phones. Examples of data transferred include phone books, address books and to-do lists. Those skilled in the art will appreciate that other remote devices 40 and data transferred are contemplated without departing from the essential spirit and scope of the invention. The computer's I/O controller (not shown) would constantly scan for transmission types it recognizes and once one is found it would initiate a data transfer.

Larger recorded audio files could be transmitted to the multimedia device 20 from embedded computers with fast, high bandwidth local area connections. An example of such a transfer would be the purchase of an MP3 audio file from a retail reseller such as a record store or gasoline station. Another example would be the transfer of personal MP3 files from the user's home computer 206 connected to the vehicle multimedia device 20 through an IEEE 802.11 standard wireless LAN.

Figure 4:
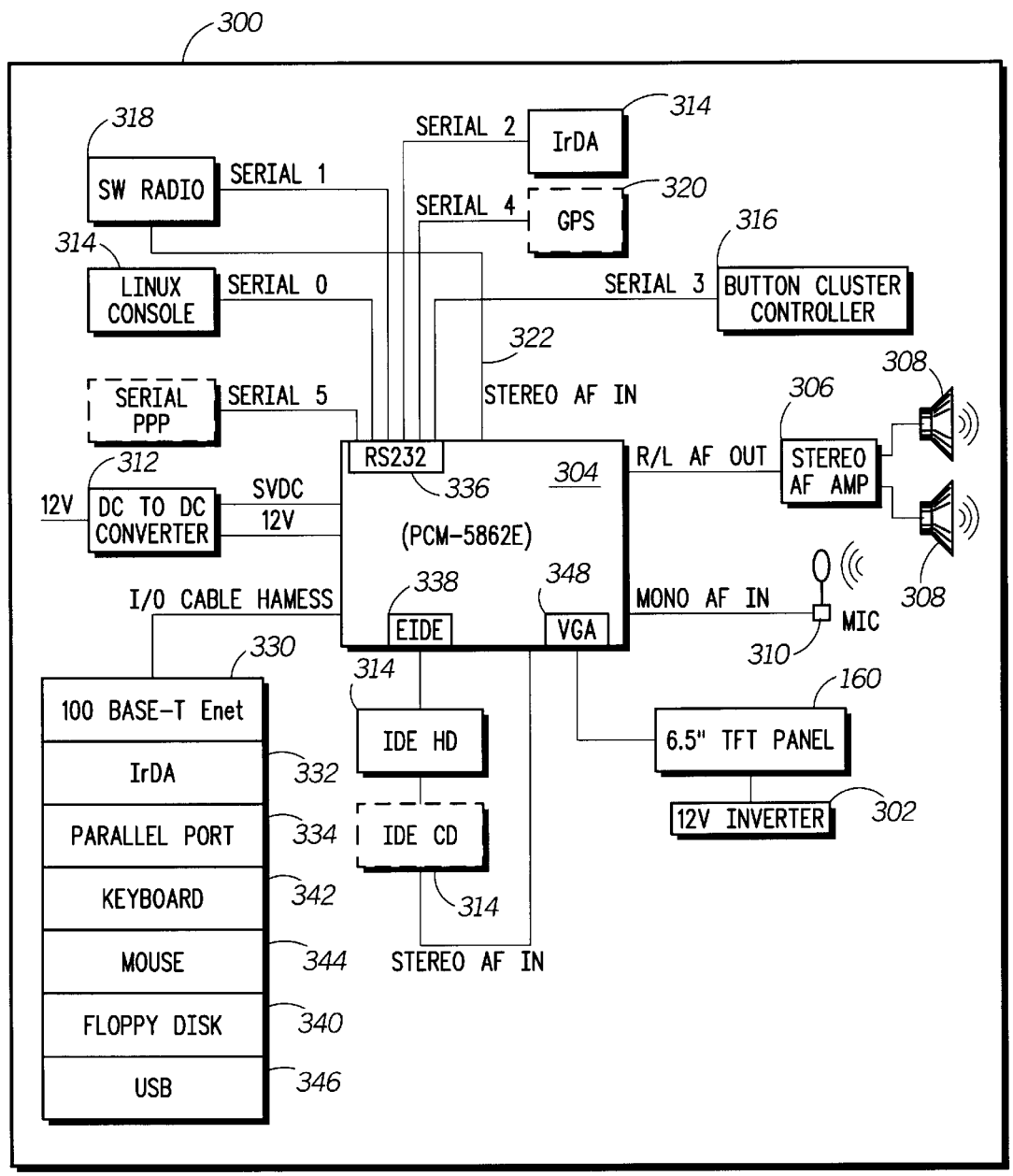
FIG. 4 is a block diagram of one presently preferred hardware platform.

Referring now to FIG. 4, one presently preferred hardware platform 300 is shown broken up into the various sections that make up the multimedia device 20 itself. Following is a description of the functions of the platform 300, as well as a functional description of one presently preferred front panel display 160. The front panel 160 is designed by Prisma Design International, Inc. In one embodiment, the front panel 160 may be a 6½ inch TFT flat panel displays powered by a 12 volt inverter 302.

The hardware platform 300 includes the components implementing the multimedia device 20. The multimedia device 20 is preferably built on an IBM PC compatible platform, running the RedHat version 6.0 Linux operating system. Many portions of the operating environment will be implemented in Java running in a VM process.

As shown in FIG. 4, the hardware platform 300 includes the following subassemblies or components. Principally, the hardware platform 300 includes a motherboard 304, a flat panel display 160, a stereo amplifier 306 and speakers 308, a microphone 310 and audio inputs 322, a power supply 312, peripheral devices 314, a button controller 316, a shortwave radio 318, and a global positioning system receiver 320. Each of these components is described in further detail below.

The multimedia motherboard 304 preferably comprises a PCM-5862E Intel Pentium motherboard sold by Advantech Co., Ltd. The motherboard 304 preferably also includes most of the hardware devices required for the hardware platform 300, such as:

100 Base-T 330

IrDA 332

Parallel Port 334

4 RS232 serial ports 336

IDE 338

Floppy disk 340

Keyboard and Mouse 342, 344

USB 346

CRT/TFT VGA controller 348

Sound (not shown)

PC/104 expansion (not shown)

1 PCI slot (not shown)

The platform 300 display preferably is a 4" 640×480 256 color VGA panel. The LCD display preferably runs from 12 V DC. The platform 300 preferably includes an after market car stereo amplifier 306 capable of driving 5 speakers 308. The speakers 308 selected and placement is done by Prisma Design. The amplifier 306 has outputs for 2 right channels, 2 left channels, and a sub woofer. The microphone 310 and audio 322 inputs will feed into the sound subsystem of the computer 304. Some type of mixer is preferred. The presently preferred embodiment uses the Mic input, and Computer 304 sound out. Additional hardware may be required for Microphone audio preprocessing. The system runs on nominal 12 V DC (up to 13.8 volts actual). The computer 304 requires 7 Amps at nominal 5 Volts. A 2.5 inch laptop 4 Gigabyte drive is used. Cabling is also provided for a CDROM hookup. A microcontroller that takes the button events of button cluster controller 316 and turns them into serial codes. The first serial port 366 is preferably assigned to the Linux console. SW Radio 318 is a radio capable of tuning the radio spectrum under RS232 computer control. The radio preferably provides stereo output when in the domestic FM band.

While the multimedia device 20 can be operated with default settings, it should be preferably configured by the user after purchase for best use. Using a remote computer 206 with an Internet connection 208, the user preferably logs into the Internet gateway network 30 in a known manner. If the user has never created an account before, he/she will first answer a series of questions to create a user profile. The user registers information about the multimedia device 20 itself (e.g., identification number, model, etc.), provide billing information, provide information about the vehicle 184 if the device is an OEM installation, and complete the purchase interest profile so that advertisements can be directed to his vehicle 184 that meet the user's buying needs.

Next, the user indicates where the multimedia unit 20 is currently located. This information will be used to access the broadcaster database 194 and retrieve tuning and other related information about those local stations that may be received in this area. If the user subscribes to a digital satellite broadcast service, that broadcaster's channels will also be retrieved. Internet audio broadcasts will also be shown.

Figure 5:
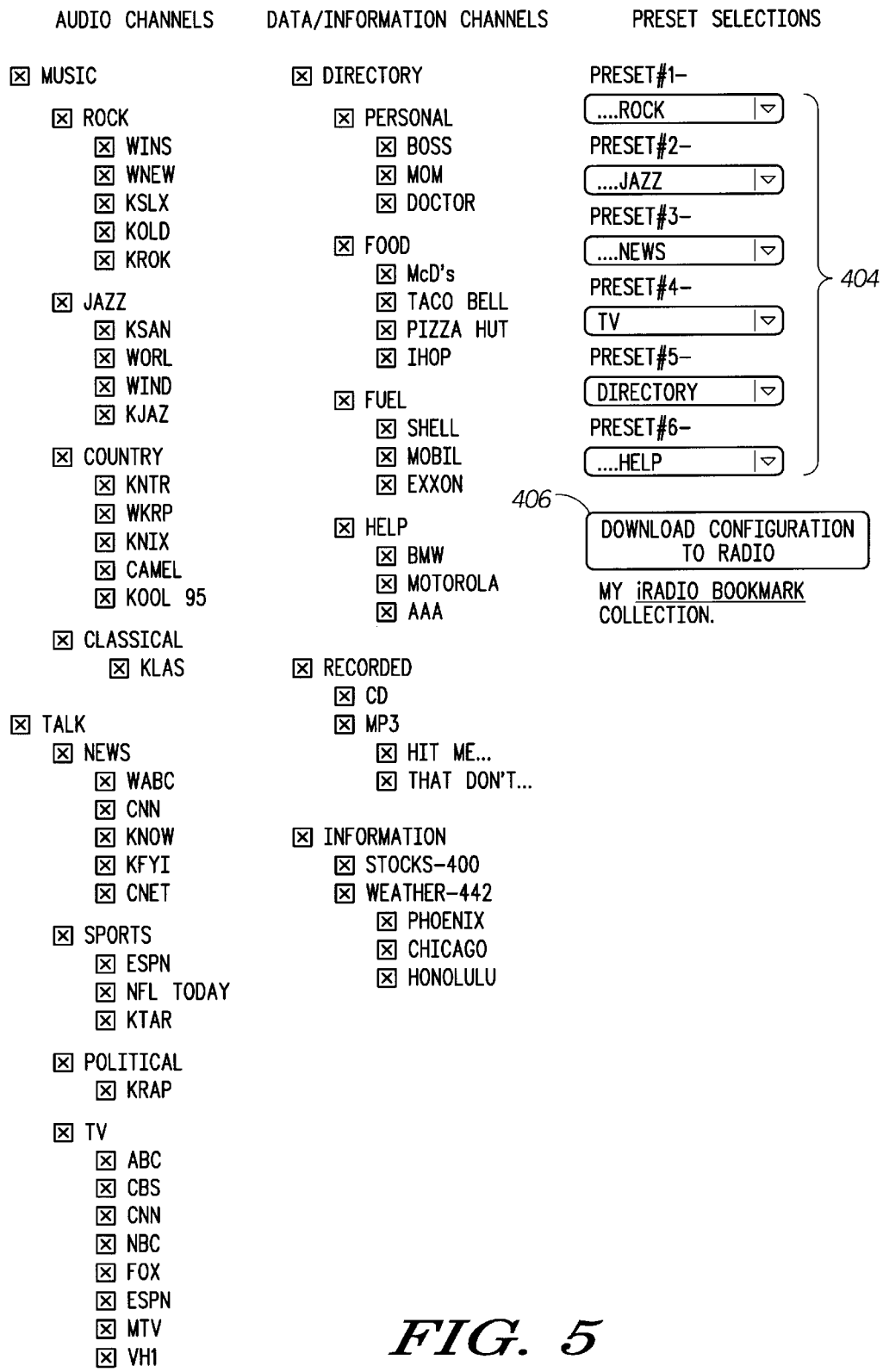
FIG. 5 illustrates sample Web configuration elements.

The user will then see a web page that will be dynamically created. It will contain all audio channels available in his area organized by format. FIG. 5 shows examples of the types of information that may be seen. By default, all formats and stations are selected. The user will then be able to check on or off which formats and individual stations he/she prefers to see on the device 20. Any format or station that is turned off will not appear on the radio display.

The user will also select those personal information channels (applications) such as stock reports 400, weather reports 402, traffic reports (not shown), etc. that the user wishes to use. These applications will be downloaded to the multimedia device 20 once the configuration session ends. The services shown will preferably grow over time as new features are added.

As shown in FIG. 5, the user can also configure the preset buttons 166 on the multimedia device 20 to select one or more channels 404 when a button 166 is pressed. Last, the user presses an option button 406 to configure the device 20 with his settings. All the formats and stations selected are transferred to the user's profile pages on the Internet gateway 30. The gateway 30 will next awaken the multimedia device 20 and then transfer the configuration data to the multimedia device's local database 198 and also download any new service applications to the device 20.

When the device 20 is instructed to tune to a particular local or satellite station in the vehicle 184, its tuning program will retrieve the band and frequency information contained in its local database of stations 194, and then tune the software programmable receiver 100 (FIG. 2) with this information. If the channel is an Internet audio broadcast, the tuning program will create a wireless Internet connection with the gateway 30 using the designated URL in its local database 194 as the source of the streaming broadcast, and will then run an appropriate application to play the broadcast.

If the vehicle 184 moves out of the geographic area used in the original configuration and so loses signal from its local stations, several corrective possibilities may happen. The user may manually request from the multimedia device 20 a recalibration of local audio stations. The location of the vehicle 184 from the GPS receiver 110 is sent to the gateway 30 and a new set of local stations are transferred back to the device 20 from the gateway broadcaster database 194. Another possibility is that if the playing station experiences a set amount of drift, that event will automatically trigger a request for a local station recalibration. It could also request from the broadcaster database 194 at the gateway 30 a list of any other receivable stations that are currently broadcasting the same programming as the fading station.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method of enabling the selection of content on a wireless communication device comprising the steps of:
   downloading information on available broadcasts;
   predetermining desired formats;
   organizing available broadcast information by desired format in a hierarchal menu;
   displaying the hierarchal menu on said wireless communication device;
   defining actions per each radio control of the wireless communication device dependent upon each menu item;
   detecting the loss of a signal for a channel providing a predetermined genre; and
   automatically tuning to comparable desired format in new broadcast area to replace the lost channel.

2. The method of enabling the selection of content on a wireless communication device of claim 1 further comprising the steps of:
   recording broadcasts for later playback; and
   listing recorded broadcasts in the hierarchal menu.

3. The method of enabling the selection of content on a wireless communication device of claim 1 further including a step of requesting, in response to user input, a list of receivable channels broadcasting the predetermined genre.

4. The method of enabling the selection or content on a wireless communication device of claim 1 further including the steps of:
   providing a location of said wireless communication device; and
   customizing advertising in the location per user preference.

5. The method of enabling the selection of content on a wireless communication device of claim 1 further including a step of automatically requesting local station recalibration.

6. The method of enabling the selection of content on a wireless communication device of claim 1 further including a step of programing a radio control for a personal user application.

7. A method of enabling the selection of content on a wireless communication device comprising the steps of:
   downloading information on available broadcasts;
   predetermining desired formats;
   organizing available broadcast information by desired format in a hierarchal menu;
   displaying the hierarchal menu on said wireless communication device;
   detecting the loss of a signal for a channel providing a predetermined genre;
   requesting a list of receivable channels broadcasting said predetermined genre; and
   automatically tuning to comparable desired format in new broadcast area to replace the lost channel.

8. The method of enabling the selection of content on a wireless communication device of claim 7 further including the steps of:
   providing a location of said wireless communication device; and
   customizing advertising in the location per user preference.

9. The method of enabling the selection of content on a wireless communication device of claim 7 further including a the steps of:
   downloading compressed data files from a high speed local area wireless receiver;
   listing the data files in the hierarchal menu.

10. The method of enabling the selection of content on a wireless communication device of claim 7 further including a step of programming a radio control for a personal user application.

11. A wireless communication device comprising:
    a receiver for receiving broadcast information and downloading information on available broadcasts in a region;
    a controller for organizing the information on available broadcasts in a hierarchal menu in accordance with predetermined desired formats, the controller also defining actions per each radio control dependent upon menu item, the controller directing the receiver to automatically tune to a comparable desired format in a new broadcast area when losing a present broadcast; and
    a user interface for enabling the selection of content the user interface including a display for displaying the hierarchal menu and control for a user to select items in the menu.

12. The wireless communication device of claim 11 wherein said controller records broadcasts for later playback and lists the recorded broadcasts in the hierarchal menu.

13. The wireless communication device of claim 11 wherein the controller for enabling the determination of location of the wireless communication device and for customizing advertising in the location per user preference.

14. The wireless communication device of claim 11 wherein said user interface enables a user to program a radio control for a personal user application.

15. The wireless communication device of claim 11 wherein the user interface is programmed by the controller to have a button to save enhanced information about a selected broadcast.

* * * * *